United States Patent [19]

Berkowitz

[11] 4,453,080
[45] Jun. 5, 1984

[54] TEMPERATURE CONTROL OF A WORKPIECE UNDER ION IMPLANTATION

[75] Inventor: Edward H. Berkowitz, Palo Alto, Calif.

[73] Assignee: Varian Associates, Inc., Palo Alto, Calif.

[21] Appl. No.: 284,915

[22] Filed: Jul. 20, 1981

[51] Int. Cl.³ .......................................... G01N 21/00
[52] U.S. Cl. .............................. 250/443.1; 250/442.1
[58] Field of Search .............. 250/442.1, 443.1, 452.2, 250/492.3; 165/80 E

[56] References Cited

U.S. PATENT DOCUMENTS 3,993,018 11/1976 Kranik et al. .................... 250/442.1
4,155,011 5/1979 Märk ................................ 250/443.1

Primary Examiner—Bruce C. Anderson
Attorney, Agent, or Firm—Stanley Z. Cole; Edward H. Berkowitz

[57] ABSTRACT

An end station for a material treatment apparatus such as ion implantation system employs a dish shaped disc for sequentially presenting a plurality of semiconductor wafers arranged on the periphery of the disc to an ion beam. Coolant is circulated via rotating joints through channels in a disc to maintain same at a preselected base temperature. A thin layer of thermally conductive resilient material is disposed between each semiconductor wafer and the disc. Centrifugal force acting to press the wafer against the resilient material establishes good thermal contact therebetween and further compression of the resilient material increases the thermal conductance of the layer whereby the temperature of the wafers under implantation is selectably controlled. In a closed loop system, wafer temperature and the temperature of the cooled dish-shaped disc are monitored by infrared sensor apparatus and the average wafer temperature signal is compared to a stable reference for deriving an error signal which is employed to alter the thermal impedance of the resilient layer.

9 Claims, 6 Drawing Figures

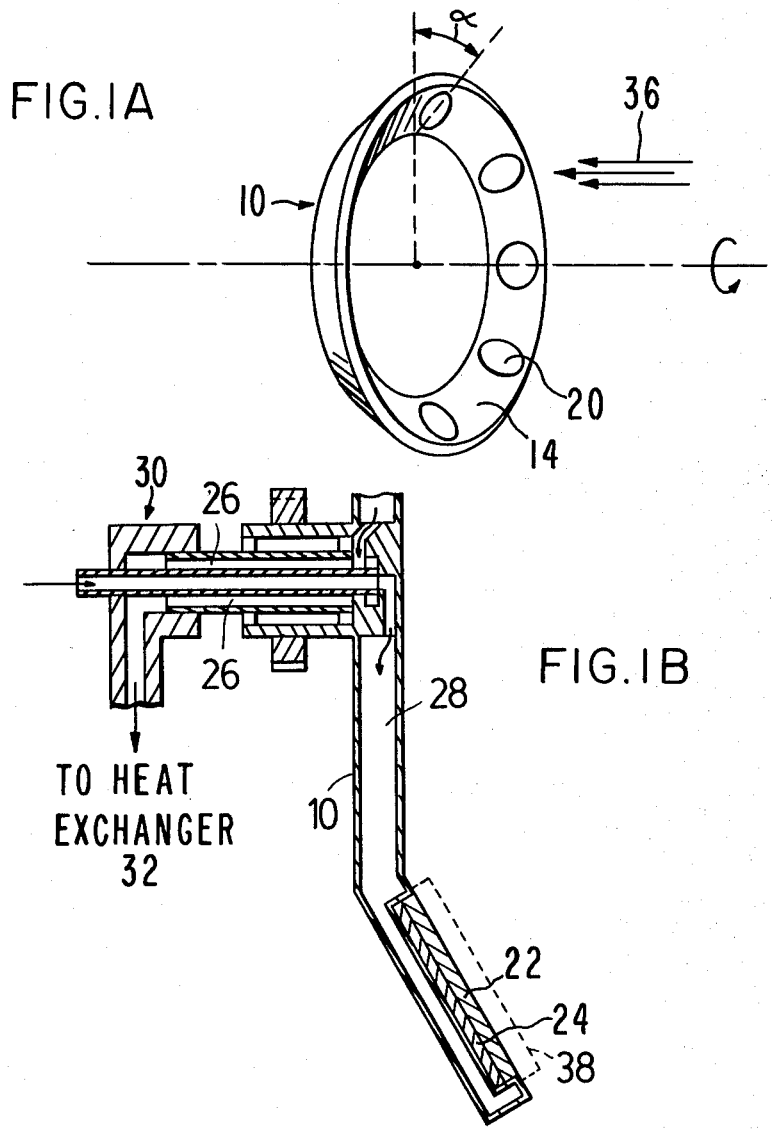
FIG.1A
FIG.1B
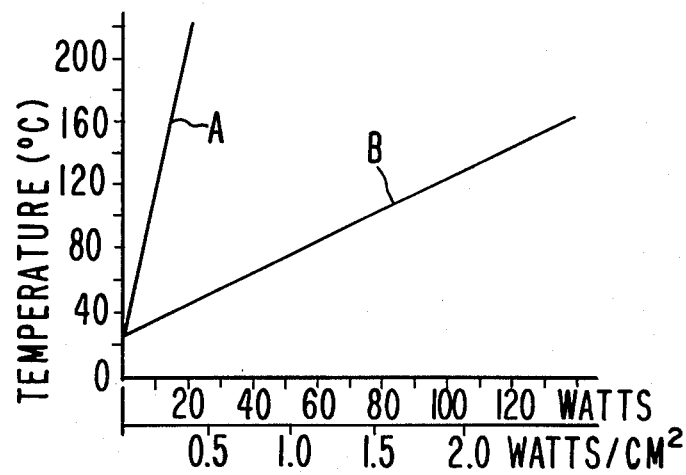
FIG.2

TEMPERATURE CONTROL OF A WORKPIECE UNDER ION IMPLANTATION

DESCRIPTION

1. Field of the Invention

The present invention relates to apparatus and method for processing materials by radiation treatment and more specifically for controlling the temperature of semiconductor wafers during ion implantation.

2. Background of the Invention

Radiation treatment of materials is used with increasing frequency to modify selected physical properties of such materials. In particular, the processing of semiconductor materials utilizes process steps which alter the electrical conductivity of the material by controlled introduction of a desired doping agent or dopant into the material. To that end, thermal diffusion processes are commonly employed and alternative apparatus and techniques for accomplishing the doping of semiconductor materials by ion implantation have lately become common.

Ion implantation exhibits a number of advantageous attributes, not the least of which is the ability to accomplish the processing at high rates, an aspect widely referred to as "throughput". High throughput necessitates exposure of the semiconductor wafers to a proportionately high flux of incident ions. The rate of dissipation of energy in the semiconductor wafer by the incident ion beam is seen to require a concomitant thermal transport away from the wafer in order to prevent undue rise of wafer temperature.

In the prior art it is known to utilize centripetal force to mechanically secure semiconductor wafers to a mounting means and one example of a dish-shaped structure for this purpose has been described by Byrd et al., J. Vac. Technol. Vol. 15 15 p. 1080–1085 (1978). Moreover, it is known to minimize temperature rise by transferring heat from the wafer to the mounting means, using the heat capacity of the mounting means as a heat sink.

It is also known in the prior art to establish a heat transfer path between a stationary wafer and an underlying heat sink by interposing a thin layer of thermally conductive resilient material between the wafer and heat sink. The wafer is clamped against the resilient material by a mechanical clamping means which establishes intimate contact with the compliant intermediate thermally conductive layer, thereby assuring good thermal contact uniformly over the surface of the wafer. An example of such art is described in U.S. Ser. No. 21,362 commonly assigned with the present invention.

BRIEF DESCRIPTION OF THE INVENTION

The present invention employs a novel aspect of processing based upon the recognition that certain beneficial aspects of the processing are exploited by carrying out the implantation at a selected temperature which may be substantially elevated with respect to the minimum heat sink temperature of the apparatus. A discussion of these beneficial aspects lay outside the scope of the present application. Some of the processes for which an elevated temperature is desirable during a part of the processing relate to minimizing radiation damage, exploiting thermal properties of certain resists which may be present as layers on the surface of the wafer, promotion of outgassing from the workpiece surface, inhibition of condensation of impurities on the surface of the wafer and diverse other phenomena. Accordingly, the present invention is directed to selectable adjustment of the wafer temperature by selectably adjusting the clamping force with which the wafer is forced against a compliant layer of thermally conductive material which is interposed between the wafer and a heat sink. As the clamping force is increased, the compliant layer and the wafer come into more intimate contact, thereby reducing the interface thermal impedance; with further increase in clamping force the compliant, or resilient layer undergoes a degree of compression which further increases the thermal conductivity (lowers the thermal impedance) of the resilient layer. In one particular embodiment the clamping force is provided by the centripetal force acting on the wafer in a rotating mount where the wafer is inclined at an angle with respect to the incident ion beam.

The range of temperature selection depends jointly upon the range of adjustment achievable in the thermal impedance of the resilient layer, the power input from the ion beam and the temperature of the heat sink. In addition to the above-described thermal impedance adjustment, the temperature of the heat sink is also selectable by circulating a coolant through a first rotating joint through channels in the rotating mounting means, thence through a second rotating conduit coaxial with the first joint, thence through known heat exchange apparatus to establish the desired heat sink temperature.

Rotation of the wafer across the ion beam provides one (angular) scanning degree of freedom. A second (radial) scanning degree of freedom approximately transverse to the rotational relative motion is provided by other means, well known but outside the scope of this application. Such transverse scan is characterized by a second scanning frequency and throughput is a function of both of these scan frequencies. Accordingly, where centripetal force is variable by adjustment of the rotational frequency, digital processing means is operative to maintain throughput adjustment of the transverse scan frequency while avoiding a standing Lissajous effect between the two frequencies which would adversely affect the uniformity of ion dosage.

In another aspect of the invention a selected temperature difference is maintained between the ion beam receiving surface of the wafer and its surrounds to minimize the deposition of condensables on the wafer surface.

It is an object of the invention to provide an improved apparatus for irradiation treatment of semiconductor materials.

In one feature of the invention, semiconductor wafers are clamped against a compliant layer of thermally conductive material interposed between each wafer and a first heat sink structure with a force of adjustable magnitude whereby the heat transport properties through the compliant layer may be adjustably controlled with rapid response.

In another feature of the invention, the first heat sink is maintained at a first selected base temperature by circulating a coolant of selected temperature through the first heat sink structure.

In another feature of the invention the force on the wafer derives from the centripetal force of rotation of the first heat sink structure.

In another feature of the invention the temperature of the wafer is selectably adjusted above the temperature of the first heat sink structure.

In yet another feature of the invention the wafer temperature is selected by adjusting the centripetal force exerted on the wafer by rotation.

In yet again another feature of the invention the beam scanning frequency in the radial direction is adjusted to compensate for changes in the rotational frequency in order to maintain throughput.

In again another feature of the invention the temperature of a shroud forming the immediate surrounds of each wafer is maintained at a lower temperature than the wafer surface whereby condensables are preferably accumulated on the surface of such shroud.

In still again another feature of the invention the wafer temperature is monitored by an infrared sensor to produce a pulse train having an amplitude proportional to the temperature of each wafer.

BRIEF DESCRIPTION OF THE FIGURES

FIG. 1A is a schematic illustration of part of the apparatus of the present invention.

FIG. 1B is partially a section of apparatus of the invention.

FIG. 2 illustrates the thermal conductivity behaviour of prior art platens. of a particular resilient layer.

FIG. 5 symbolically illustrates another embodiment.

DETAILED DESCRIPTION OF THE INVENTION

Figure 3:
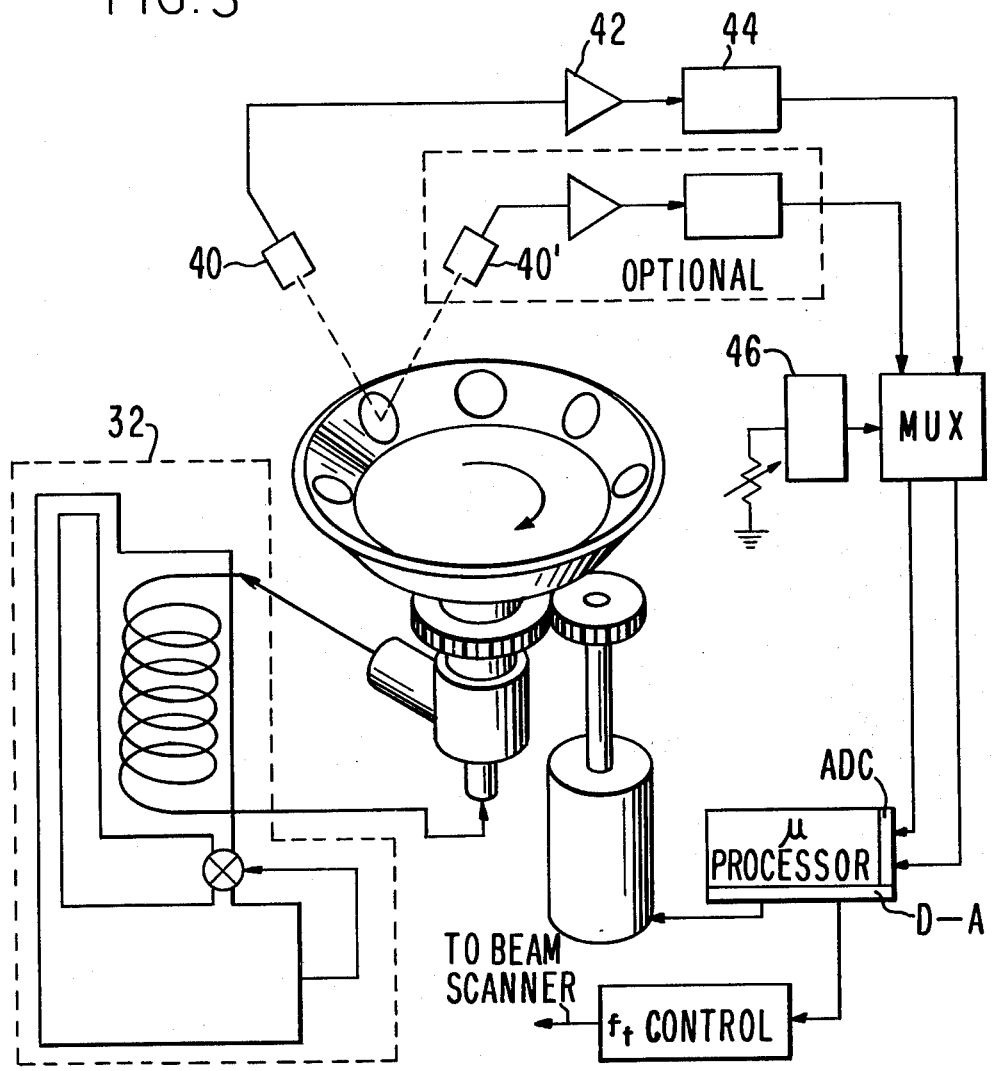
FIG. 3 shows a schematic illustration of an embodiment of the invention.

The apparatus is best described by reference to FIGS. 1A and B wherein a disc 10 is adapted for rotation about an axis 12 through the center of the disc and normal to the plane thereof. The disc 10 is preferably made of aluminum and includes a peripheral portion 14 which is dished at a first angle with respect to the plane of the disc.

Arranged on the peripheral portion 14 are cavities 20 which are of such dimensions to receive semiconductor wafers 22. Interposed between each semiconductor wafer 22 and the floor 24 of the cavity is a layer of compliant material 25 distinguished by relatively high thermal conductivity. A representative such material can be found among RTV silicone rubber materials, for example.

Channels 26 and 28 are formed in the interior of the disc 10 for circulation of a coolant therethrough. (These are illustrated schematically in FIG. 1B.) To this end a rotating joint 30 is provided to form a conduit for such coolant into channel 26 and to return the coolant through channel 28 to heat exchanger 32 (not shown). The details of the rotating fluid coupling joint are outside the scope of the invention. Such rotating joints are commercially available and well known. The temperature of the coolant is established by the heat exchanger of associated refrigerating equipment (not shown) in conventional fashion with respect to a temperature range which is selectable in accord with well-known techniques. In this way a very low temperature for the heat sink may be realized, thereby affording a wide range of operating temperature for the temperature controlling feature of the invention.

In a typical arrangement, an ion beam 36 impinges each wafer tracing an arcuate path across the wafer on the disc 10 rotating about axis 12 through the ion beam. The ion beam is modulated at an appropriate rate to translate the arcuate path radially across the surface of the wafer, to uniformly implant the wafer. The radial scan (transverse to the direction of rotation is carried out at a frequency $\omega_r$ subject to the constraint that $\omega_o$ (the angular frequency) and $\omega_r$ are not harmonically related. The occurrence of such harmonic relationship would result in a standing Lissajous pattern which would seriously impair the uniformity of ion dosage. The avoidance of harmonic relationship is here understood to include avoidance of approximately harmonic relationships because such near relationships will also adversely affect the dosage distribution uniformity, unless implantation is averaged over a sufficiently large number of cycles.

Power is dissipated in the wafer during implantation by absorption of the energy of the ion beam. In one typical example, a beam current of the order of 5 ma. may be absorbed at an ion energy of 100 kev for a power dissipation of 500 watts. The heat evolved is to a small degree radiated from the wafer. Predominantly, it is transferred over a heat path through the wafer, thence through the compliant layer to the cooled disc and through the circulating coolant to the heat exchanger. Therefore, each wafer experiences thermal input as a sharp thermal pulse at the repitition rate $\omega_o$.

The temperature $T_w$ of the wafer is obtained from $$T = T_w - T_o = PZ$$

where $T_o$ is the temperature of the heat reservoir to which power P, dissipated in the wafer, is transferred through the thermal impedance Z. An upper limit to the value of P is assumed to be fixed by limitations of the ion implanter apparatus although the instantaneous value may vary somewhat with variation in beam current. The temperature $T_o$ is adjustable through the refrigeration and heat exchanger apparatus using well-known methods outside the scope of the invention. It will suffice to note that commercial equipment is available for maintaining $T_o$ at a value limited principally by the performance of the rotating joint and the parameters of the particular cooling fluids employed for the primary cooling loop.

It will be observed that the disc 10 does not sustain rapid temperature changes because of the high heat capacity which it represents relative to the semiconductor wafers. The individual wafers, on the other hand, are of relatively small mass and subject to fluctuations in the incident ion beam. It is possible to control the thermal impedance of the compliant layer by adjustment of the clamping force exerted on the wafer. The thermal impedance properties vary in accord with the exerted force in that (a) the sum of incremental microscopic contact area between the wafer 22 and layer 24 varies with the applied force, limited by the mechanical properties of the wafer; (b) the thickness of the compliant layer decreases in proportion to the applied force causing the layer to present a somewhat shortened thermal path; and (c) the thermal impedance is lowered by the compression and increased density of the resilient material. In the stationary platen of the prior art the scale of clamping force range is applied by a relatively massive ring shaped member which bears on a peripheral portion of each wafer. In the present invention the centripetal force during operation adds to a fixed mechanical loading to vary the thermal contact through resilient layer 24 to the cooled disc 10.

FIG. 2 shows several characteristics of two prior art wafer platen arrangements. Each line represents the locus of equilibrium temperature rise attained for each. The line A indicates the temperature rise of the irradiated wafer as a function of ion beam power dissipated therein where the heat transport mechanism from the wafer is almost entirely by radiation. The line B is the thermal response wherein the wafer is mechanically clamped to a resilient thermally conductive pad as in the above referenced prior art operation and the heat transport mechanism is largely conductance. In both of these arrangements the heat sink temperature is 20° C. The present invention affords a means to operate on a selected line intermediate these extremes in proportion to the force exerted on the wafer in excess of a fixed clamping force consequent to the rotation of the wafer about an axis located outside of and having a substantial component perpendicular to the plane of the wafer.

It will be appreciated that the operational limiting characteristics depend upon the heat sink temperature. Although prior platens of FIG. 2 are shown operating from a 20° C. heat sink, this temperature can be considerably lower. The consequence of lowering the wafer temperature is that residual vapor impurities may preferentially condense thereon. Thus it is desirable that the wafer not be maintained at too low a temperature. Thus there is shown symbolically in FIG. 1 a shroud 38 which is maintained at heat sink temperature $T_o$ in proximity to the wafer to collect condensables preferentially thereon. Practical limitations for heat sink temperature are present in the performance of the rotating joint for the circulating coolant. One appreciates, however, that the temperature $T_o$ is not susceptible to rapid variation whereas the adjustment of the thermal impedance between the wafer and the heat sink can be rapidly adjusted in accord with the present invention.

In the described embodiment, rotational frequency is adjusted to effect the clamping force on the wafer. In such a centripetal force-based system the clamping force is not independent of throughput. It will be observed that whereas the rate of ion implantation or throughput, is linear in the rotational rate, the clamping force is quadratically dependent on rotational frequency. Consequently, a rather large range of clamping force is comprehended within a small interval of rotational frequency. In a typical system as described, the scan rate in one dimension is obtained from the rotational frequency, $\omega_o$, whereas the transverse scan rate of the beam $\omega_r$ is independently derived, and constrained only in that there be no harmonic relationship in the two scan frequencies. As indicated above, such harmonic relationship gives rise to a standing wave pattern in the ion dose distribution which can produce a very significant non-uniformity in dopant concentration. Thus, the variation in rotational frequency will, from scanning considerations, effect a corresponding variation in the transverse scanning rate if scan frequency relationships are to be maintained. The transverse rate which is ordinarily an order of magnitude or so slower (or faster) than the rotation rate, may be varied in inverse proportion to the variation of the rotational rate so as to minimize any variation of throughput. The consideration of transverse frequency is best controlled by a microprocessor or other programmable control apparatus in order to maintain throughput at an optimum value and to prevent the occurrence of standing wave patterns in the dopant concentration.

Figure 4:
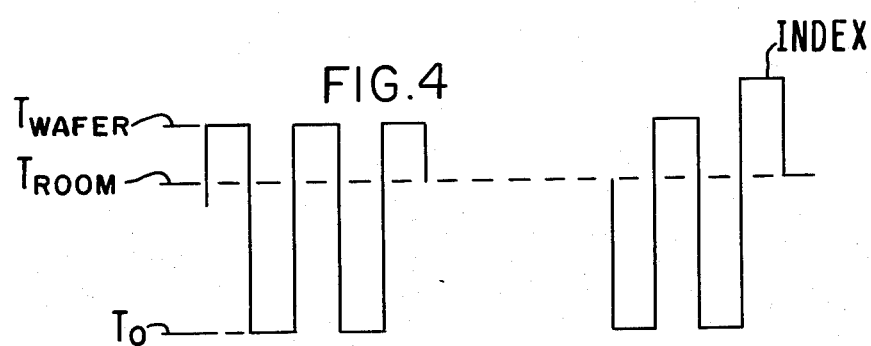
FIG. 4 shows the signal generated by the infrared sensor.

What has been described is an open loop system in regard to wafer temperature. In another embodiment sketched in FIG. 3 one or more infrared sensors 40 and 40' are provided to monitor the (average) temperature and temperature difference between the wafers and the disc (heat sink). The output of each sensor is an asymmetrical bipolar square wave of FIG. 4. The null point is a reference temperature which is conveniently room temperature. The extremes of each signal represent the temperatures $T_o$ of the sink and $T_w$ of the wafer. An indexing pulse may be made available if desired by well known techniques to provide further thermal calibration. The average peak-to-peak value is obtained, for example, by an analogue amplifier 42 and integration network 44 which in the simplest case provides a temperature proportional voltage for comparison against a voltage obtained from an appropriate regulated source 46, as for example, a zener diode and potentiometer for selecting a reference voltage corresponding to a desired wafer temperature. An error signal may be derived to control the rotational frequency through known circuitry. A second infrared sensor 40' may also be used to monitor the time average temperature of the wafers. In such case, sensor 40 is disposed to sense the temperature of the wafer following bombardment and sensor 40' is focused upon wafers in an angular sector immediately prior to rotation of the wafer in front of the ion beam. The two separate averages are processed by respective channels of circuitry and compared. A signal indicative of operation outside the desired range of temperatures will cause the controlling processer to enter a diagnostic mode to ascertain whether the instantaneous power dissipated in the wafers is excessive or whether the thermal path is incapable of transferring heat at the required rate; and to take an appropriate action. Other diagnostic procedures and remedial steps will readily occur to the skilled equipment designer.

The present apparatus has been described in reference to a rotating platen wherein temperature control of wafers is obtained by variation of the rotational frequency which also provides the scan. Forces other than centripetal force (e.g. electrostatic, pure clamping) may be utilized to practice the invention in like manner. FIG. 5 symbolically illustrates an embodiment where the adjustable clamping force is electrostatic in nature.

Since many changes could be made in the above construction and many apparently widely different embodiments of the invention could be made without departing from the scope thereof, it is intended that all matter contained in the above description or shown in the accompanying drawings shall be interpreted as illustrative and not in a limiting sense.

What I claim is:

1. In an end station for presenting a generally planar article to an ion beam for ion implantation, said end station comprising mounting means for rotating said article through said ion beam at a frequency $\omega_o$ and maintaining the position of said articles on said mounting means by centrifugal force acting on said article, mounting means further comprising heat sink means for receiving heat dissipated in said articles from ion implantation, the improvement comprising a compliant thermally conductive resilient layer disposed between said heat sink and said article and said article maintained in intimate contact therewith by the action of said centrifugal force, means for monitoring the temperature of said article and generating a signal representative of said temperature and means responsive to said signal for selectably adjusting the force exerted by said article on said thermally conductive member whereby the rate at which heat is transported through the thermally conductive member to the heat sink is selectably controlled.

2. The apparatus of claim 1 wherein said means for adjusting the force exerted by said article comprises means for altering the rotational frequency $\omega_o$.

3. The apparatus of claim 1 further comprising means for scanning said ion beam in a radial direction with respect to said rotating disc at a frequency $\omega_r$.

4. The apparatus of claim 2 comprising means for altering $\omega_r$ in response to changes in $\omega_o$ whereby the time interval required for processing said article remains substantially constant.

5. Apparatus for controlling the temperature of at least one substrate subject to ion implantation during said ion implantation, comprising means for transferring heat arising from ion implantation in said substrate to a heat sink through a thermal impedance of adjustable magnitude and means for accomplishing adjustment of said thermal impedance during said implantation, means for monitoring the temperature of said substrate and generating a signal representative of said temperature, means responsive to said temperature signal for controlling said adjustment of said thermal impedance of adjustable magnitude, whereby the rate at which heat is transferred from said substrate to said heat sink is controlled.

6. The apparatus of claim 5 wherein said means for monitoring comprises at least one infrared radiation detector responsive to the temperature of said wafer.

7. The apparatus of claim 6 comprising means for periodically subjecting said substrate to ion implantation.

8. The apparatus of claim 7 wherein said means for monitoring comprises a first infrared detector responsive to the temperature of said substrate prior to said period of ion implantation and a second infrared detector responsive to the temperature of said substrate after said period of ion implantation.

9. The apparatus of claim 7 comprising means for changing the rate of ion implantation in response to said temperature monitoring means whereby said substrate is protected when said heat in said substrate exceeds the operative range of said means for transfering heat.

* * * * *